(12) United States Patent
Matsui et al.

(10) Patent No.: US 8,384,422 B2
(45) Date of Patent: Feb. 26, 2013

(54) TERMINAL RESISTANCE DEVICE, SEMICONDUCTOR DEVICE, AND CONTROL METHOD FOR TERMINAL RESISTANCE

(75) Inventors: Yuuji Matsui, Kanagawa (JP); Noriaki Suyama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 340 days.

(21) Appl. No.: 12/626,793

(22) Filed: Nov. 27, 2009

(65) Prior Publication Data

US 2010/0134214 A1    Jun. 3, 2010

(30) Foreign Application Priority Data

Nov. 28, 2008  (JP) .................................. 2008-304756

(51) Int. Cl.
*H03K 17/16* (2006.01)
*H03K 19/003* (2006.01)

(52) U.S. Cl. .......................................... 326/30; 326/21
(58) Field of Classification Search .................. None
See application file for complete search history.

(56) References Cited

U.S. PATENT DOCUMENTS

| | | | |
|---|---|---|---|
| 7,135,884 B1 * | 11/2006 | Talbot et al. ..................... | 326/30 |
| 7,193,431 B2 | 3/2007 | Miyake et al. | |
| 7,382,152 B2 * | 6/2008 | Hamanaka ..................... | 326/30 |
| 7,446,557 B2 * | 11/2008 | Mauthe et al. .................. | 326/30 |
| 7,595,656 B2 | 9/2009 | Hayami et al. | |
| 2004/0021481 A1 * | 2/2004 | Ohno .............................. | 326/30 |
| 2006/0044008 A1 | 3/2006 | Miyake et al. | |
| 2008/0180130 A1 | 7/2008 | Hayami et al. | |

FOREIGN PATENT DOCUMENTS

| | | |
|---|---|---|
| JP | 2006-066833 | 3/2006 |
| JP | 2008-182516 | 8/2008 |

* cited by examiner

*Primary Examiner* — Crystal L Hammond
(74) *Attorney, Agent, or Firm* — Young & Thompson (57) ABSTRACT

One aspect of the invention is a terminal resistance device including a variable terminal resistance unit including a plurality of first terminal resistance elements connectable to a transmission path and a terminal resistance control unit that transmits a first control signal of a thermometer code to the variable terminal resistance unit. The first terminal resistance elements have the same resistance value and the first control signal is a signal for selecting the first terminal resistance elements to be connected to the transmission path.

10 Claims, 9 Drawing Sheets

FIRST EXEMPLARY EMBODIMENT: THERMOMETER CODE

| GATE WIDTH WHEN TERMINAL RESISTANCE ELEMENT IS ASSUMED AS ONE TRANSISTOR | W0 = 1 | W1 = 1 | W2 = 1 | W3 = 1 | ... | W13 = 1 | W14 = 1 | SUMMATION OF GATE WIDTH W | HAMMING DISTANCE WHEN CODE CHANGES BY ONE |
|---|---|---|---|---|---|---|---|---|---|
| CONTROL SIGNAL | NDRV[0] | NDRV[1] | NDRV[2] | NDRV[3] | ... | NDRV[13] | NDRV[14] | | |
| CODE | 0 | 0 | 0 | 0 | | 0 | 0 | 0 | |
| | 1 | 0 | 0 | 0 | | 0 | 0 | 1 | 1 |
| | 1 | 1 | 0 | 0 | | 0 | 0 | 2 | 1 |
| | 1 | 1 | 1 | 0 | | 0 | 0 | 3 | 1 |
| | 1 | 1 | 1 | 1 | | 0 | 0 | 4 | 1 |
| | 1 | 1 | 1 | 1 | | 0 | 0 | 5 | 1 |
| | 1 | 1 | 1 | 1 | | 0 | 0 | 6 | 1 |
| | 1 | 1 | 1 | 1 | | 0 | 0 | 7 | 1 |
| | 1 | 1 | 1 | 1 | | 0 | 0 | 8 | 1 |
| | 1 | 1 | 1 | 1 | | 0 | 0 | 9 | 1 |
| | 1 | 1 | 1 | 1 | | 0 | 0 | 10 | 1 |
| | 1 | 1 | 1 | 1 | | 0 | 0 | 11 | 1 |
| | 1 | 1 | 1 | 1 | | 0 | 0 | 12 | 1 |
| | 1 | 1 | 1 | 1 | | 1 | 0 | 13 | 1 |
| | 1 | 1 | 1 | 1 | | 1 | 0 | 14 | 1 |
| | 1 | 1 | 1 | 1 | | 1 | 1 | 15 | 1 |

Fig. 3

|  | RELATED ART BINARY CODE ONLY | FIRST EXEMPLARY EMBODIMENT THERMOMETER CODE ONLY |
| --- | --- | --- |
| NUMBER OF CODE | 16 | 16 |
| NUMBER OF CODE SIGNAL LINES OF P-TYPE SIDE | 4 | 15 |
| NUMBER OF CODE SIGNAL LINES OF N-TYPE SIDE | 4 | 15 |
| MAXIMUM HAMMING DISTANCE | 4 | 1 |

SECOND EXEMPLARY EMBODIMENT: BINARY CODE AND THERMOMETER CODE

| GATE WIDTH WHEN TERMINAL RESISTANCE ELEMENT IS ASSUMED AS ONE TRANSISTOR | W0 2 | W1 2 | W2 2 | ... | W6 2 | W7 1 | SUMMATION OF GATE WIDTH W | HAMMING DISTANCE WHEN CODE CHANGES BY ONE |
|---|---|---|---|---|---|---|---|---|
| CONTROL SIGNAL | NDRV[0] | NDRV[1] | NDRV[2] | ... | NDRV[6] | NDRV[7] | | |
| CODE | 0 | 0 | 0 | | 0 | 0 | 0 | |
|  | 0 | 0 | 0 | | 0 | 1 | 1 | 1 |
|  | 1 | 0 | 0 | | 0 | 0 | 2 | 2 |
|  | 1 | 0 | 0 | | 0 | 1 | 3 | 1 |
|  | 1 | 1 | 0 | | 0 | 0 | 4 | 2 |
|  | 1 | 1 | 0 | | 0 | 1 | 5 | 1 |
|  | 1 | 1 | 1 | | 0 | 0 | 6 | 2 |
|  | 1 | 1 | 1 | | 0 | 1 | 7 | 1 |
|  | 1 | 1 | 1 | | 0 | 0 | 8 | 2 |
|  | 1 | 1 | 1 | | 0 | 1 | 9 | 1 |
|  | 1 | 1 | 1 | | 0 | 0 | 10 | 2 |
|  | 1 | 1 | 1 | | 0 | 1 | 11 | 1 |
|  | 1 | 1 | 1 | | 0 | 0 | 12 | 2 |
|  | 1 | 1 | 1 | | 0 | 1 | 13 | 1 |
|  | 1 | 1 | 1 | | 1 | 0 | 14 | 2 |
|  | 1 | 1 | 1 | | 1 | 1 | 15 | 1 |

Fig. 6

THIRD EXEMPLARY EMBODIMENT: BINARY CODE AND THERMOMETER CODE

| GATE WIDTH WHEN TERMINAL RESISTANCE ELEMENT IS ASSUMED AS ONE TRANSISTOR | W0 4 | W1 4 | W2 4 | W3 2 | W4 1 | | |
|---|---|---|---|---|---|---|---|
| CONTROL SIGNAL | NDRV[0] | NDRV[1] | NDRV[2] | NDRV[3] | NDRV[4] | SUMMATION OF GATE WIDTH W | HAMMING DISTANCE WHEN CODE CHANGES BY ONE |
| CODE | 0 | 0 | 0 | 0 | 0 | 0 | |
| | 0 | 0 | 0 | 0 | 1 | 1 | 1 |
| | 0 | 0 | 0 | 1 | 0 | 2 | 2 |
| | 0 | 0 | 0 | 1 | 1 | 3 | 1 |
| | 1 | 0 | 0 | 0 | 0 | 4 | 2 |
| | 1 | 0 | 0 | 0 | 1 | 5 | 1 |
| | 1 | 0 | 0 | 1 | 0 | 6 | 2 |
| | 1 | 0 | 0 | 1 | 1 | 7 | 1 |
| | 1 | 1 | 0 | 0 | 0 | 8 | 2 |
| | 1 | 1 | 0 | 0 | 1 | 9 | 1 |
| | 1 | 1 | 0 | 1 | 0 | 10 | 2 |
| | 1 | 1 | 0 | 1 | 1 | 11 | 1 |
| | 1 | 1 | 1 | 0 | 0 | 12 | 2 |
| | 1 | 1 | 1 | 0 | 1 | 13 | 1 |
| | 1 | 1 | 1 | 1 | 0 | 14 | 2 |
| | 1 | 1 | 1 | 1 | 1 | 15 | 1 |

| GATE WIDTH W | W0 = 1 | W1 = 2 | W2 = 4 | W3 = 8 | SUMMATION OF GATE WIDTH W | HAMMING DISTANCE WHEN CODE CHANGES BY ONE |
|---|---|---|---|---|---|---|
| CONTROL SIGNAL | NDRV[0] | NDRV[1] | NDRV[2] | NDRV[3] | | |
| CODE | 0 | 0 | 0 | 0 | 0 | |
|  | 1 | 0 | 0 | 0 | 1 | 1 |
|  | 0 | 1 | 0 | 0 | 2 | 2 |
|  | 1 | 1 | 0 | 0 | 3 | 1 |
|  | 0 | 0 | 1 | 0 | 4 | 3 |
|  | 1 | 0 | 1 | 0 | 5 | 1 |
|  | 0 | 1 | 1 | 0 | 6 | 2 |
|  | 1 | 1 | 1 | 0 | 7 | 1 |
|  | 0 | 0 | 0 | 1 | 8 | 4 |
|  | 1 | 0 | 0 | 1 | 9 | 1 |
|  | 0 | 1 | 0 | 1 | 10 | 2 |
|  | 1 | 1 | 0 | 1 | 11 | 1 |
|  | 0 | 0 | 1 | 1 | 12 | 3 |
|  | 1 | 0 | 1 | 1 | 13 | 1 |
|  | 0 | 1 | 1 | 1 | 14 | 2 |
|  | 1 | 1 | 1 | 1 | 15 | 1 |

TERMINAL RESISTANCE DEVICE, SEMICONDUCTOR DEVICE, AND CONTROL METHOD FOR TERMINAL RESISTANCE

BACKGROUND

1. Field of the Invention

The present invention relates to a terminal resistance device, a semiconductor device including the same, and a control method for a terminal resistance.

2. Description of Related Art

Recently, personal computers, servers, work stations and the like have increased in processing speed. In these devices, a signal amplitude which is transmitted between semiconductor devices in such devices becomes smaller so that a delay time for signal transmission is minimized. In the semiconductor devices in which speeding up of processing is required, a technique in which an impedance matching circuit called On Die Termination (ODT) is provided is often used to cut down signal noise and prevent impedance from being unmatched.

Figure 8:
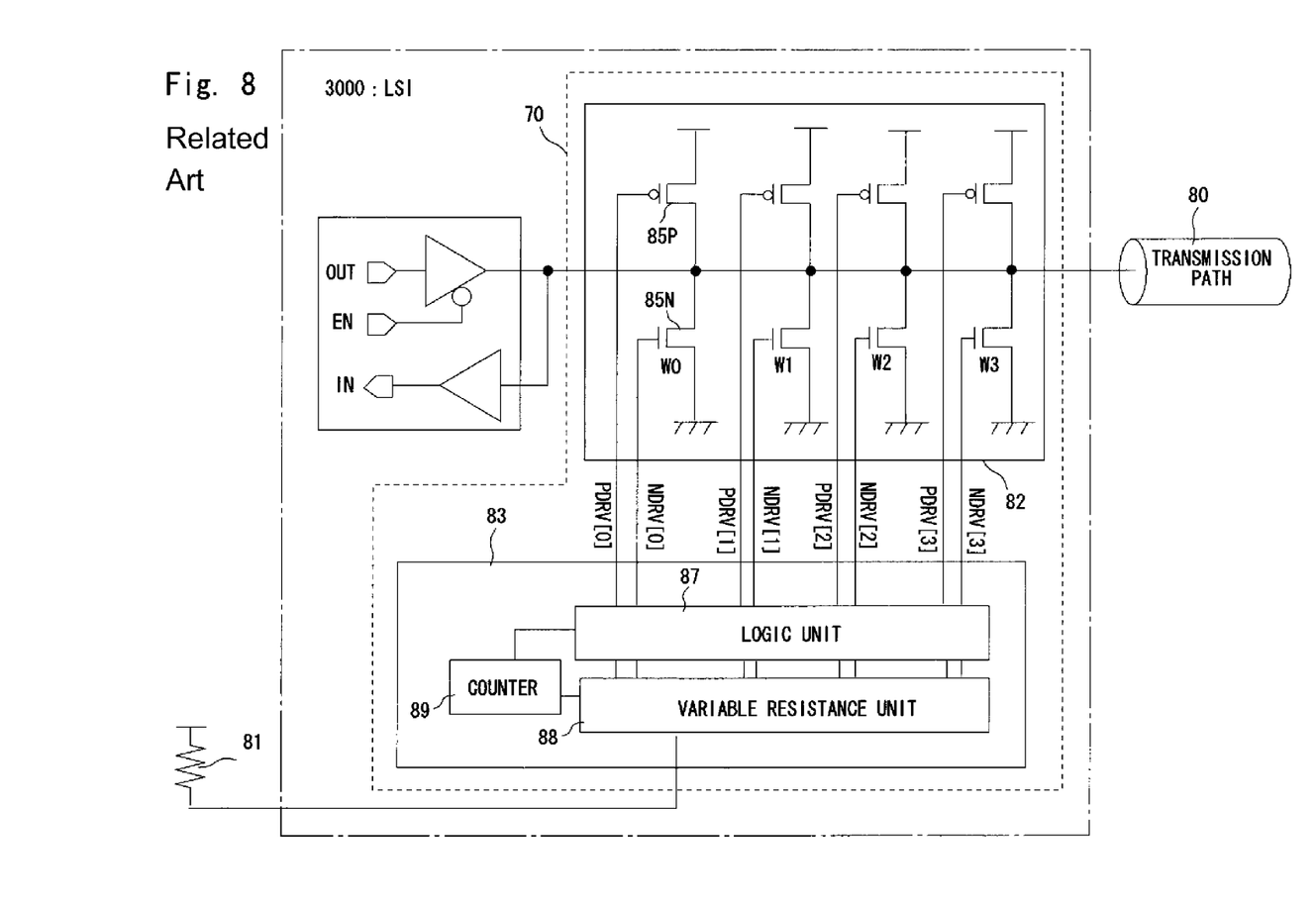
FIG. 8 is a diagram showing a configuration of a terminal resistance device 70 disclosed in Japanese Unexamined Patent Application Publication No. 2006-66833.

FIG. 8 shows a configuration of a terminal resistance device 70 disclosed in FIG. 4 of Japanese Unexamined Patent Application Publication No. 2006-66833. In the Japanese Unexamined Patent Application Publication No. 2006-66833, an LSI 3000 of a transmitting end device provides the terminal resistance device 70 as an interface circuit. The terminal resistance device 70 is configured with a variable terminal resistance unit (ODT circuit) 82 and a terminal resistance control unit (ODT control unit) 83. The variable terminal resistance unit 82 respectively has a plurality of terminal resistance elements 85P and 85N between a transmission path 80 and a source voltage line or a ground voltage line. The terminal resistance elements 85P and 85N are configured with P-type and N-type Metal-Oxide-Semiconductor Field-Effect Transistors (MOSFETs). The P-type transistors of the terminal resistance elements 85P are provided between the transmission path 80 and the source voltage line. The N-type transistors of the terminal resistance elements 85N are provided between the transmission path 80 and the ground voltage line.

The terminal resistance elements 85P and 85N have different resistance values from each other. The resistance values can be adjusted by varying a gate width of the transistor and will be explained using the gate width. For purpose of explanation, gate widths W of terminal resistance elements 85N are represented by W0, W1, W2, and W3 in the order from transistor on the left side in FIG. 8. A ratio of W0:W1:W2:W3 is 1:2:4:8. In the same way, a ratio of the gate widths of the terminal transistor elements 85P is 1:2:4:8 in the order from transistor on the left side in FIG. 8. In the terminal resistance elements 85P and 85N configured as described above, control signals PDRV[0] to [3] and NDRV[0] to [3] transmitted to the gate of each transistor can control connections between the terminal transistor elements 85P and 85N and the transmission path 80.

The terminal resistance control unit 83 includes a logic unit 87, a variable resistance unit 88, and a counter 89. The variable resistance unit 88 provides compare resistance elements (not shown) corresponding to each the terminal resistor elements 85P and 85N of the variable terminal resistance unit 82. Each compare resistance elements is configured such that a plurality of transistors is connectable to a detect point, as in the variable terminal resistance unit 82. Gate of the compare resistance elements receive the control signals which are identical with the control signals PDRV[0] to [3] and NDRV [0] to [3] transmitted to the gates of the terminal resistance elements 85P and 85N. The compare resistance elements are switched to be connected to the detect point by the control signals NDRV and PDRV.

The logic unit 87 sequentially generates code signals based on an output of the counter 89. The logic unit 87 transmits the generated code signals as the control signals PDRV and NDRV to the variable terminal resistance unit 82 and the variable resistance unit 88. The logic unit 87 compares a voltage of the detect point and a reference voltage of a resistance 81, and sets signal states of the control signals PDRV[0] to [3] and NDRV[0] to [3] based on a result of comparison.

Figure 9:
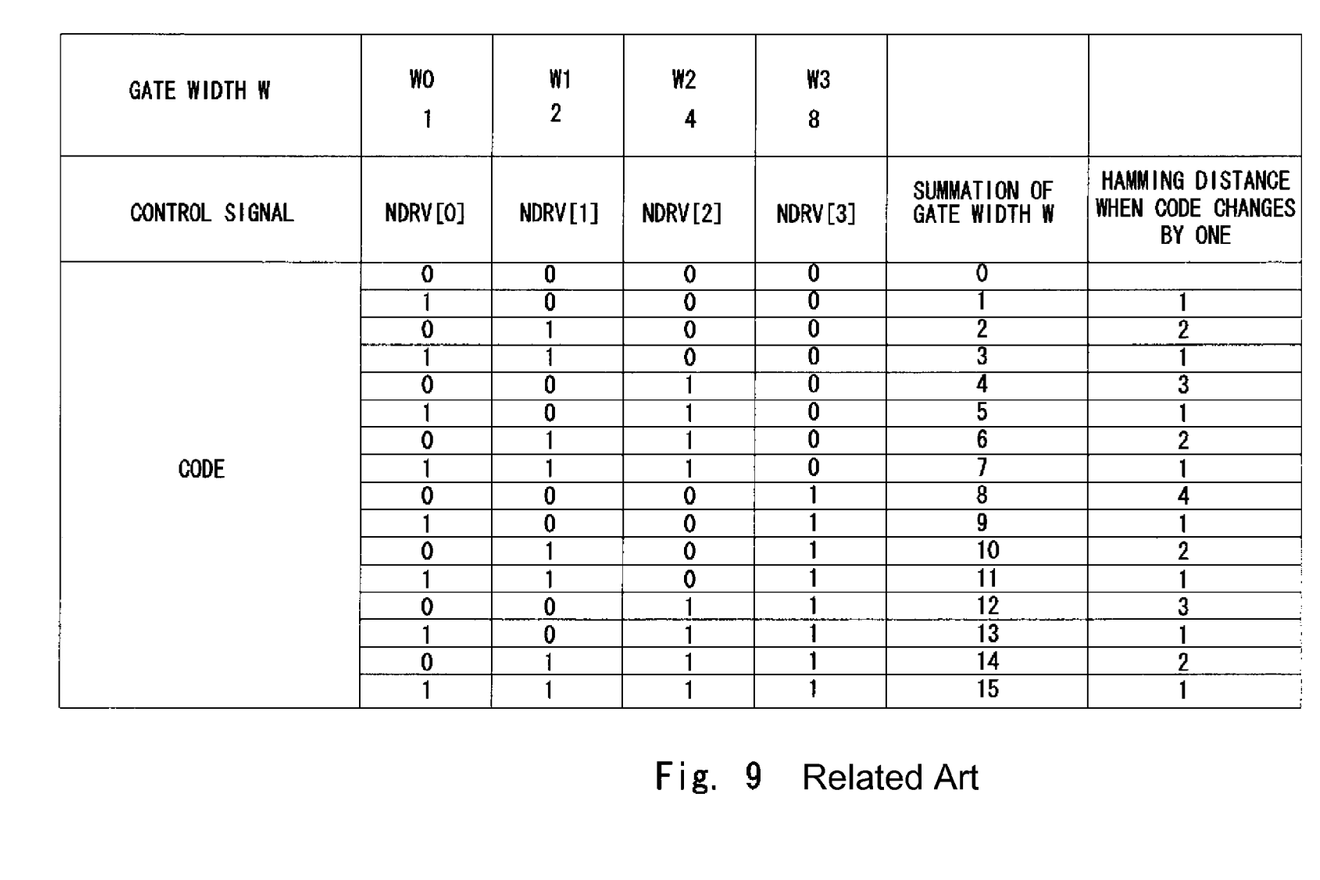
FIG. 9 is a table showing changing states of code signals generated in the logic unit 87 in Japanese Unexamined Patent Application Publication No. 2006-66833.

FIG. 9 shows changing signal states of the code signals generated in the logic unit 87. The logic unit 87 selects terminal resistance elements 85P and 85N to be connected to the transmission path 80 on the P-type side and N-type side to adjust the terminal resistance. However, for ease of explanation, the case in which the logic unit 87 sets the connection of only the terminal resistance elements 85N of N-type transistors will be described. As described above, the ratio of the gate widths of the terminal resistance elements 85N is W0:W1:W2:W3=1:2:4:8 in the order from the transistor on the left side in FIG. 8.

The logic unit 87 sequentially increments the code signals based on the output of the counter 89. Specifically, in the case where a summation of the gate widths W of the terminal resistance elements 85N, which are connected to the transmission path 80, is set to "0", the control signals NDRV[0] to [3] are set to "0". After this manner, all the terminal resistance elements 85N are disconnected from the transmission path 80. In another case where the summation of the gate widths W of the terminal resistance elements 85N, which are connected to the transmission path 80, is set to "1", only the control signal NDRV[0] transmitted to the terminal resistance element 85N having a gate width W0=1 is set to "1" and the other control signals NDRV[1] to [3] are set to "0". After this manner, the terminal resistance element 85N having the gate width W0=1 is connected to the transmission path 80.

The summation of the gate widths W of the terminal resistance elements 85N, which are connected to the transmission path 80, becomes larger in accordance with increase of a value of the code signal. A terminal resistance value can be represented as an inverse number of the summation of the gate widths W of the terminal resistance elements 85N connected to the transmission path 80. Accordingly, the terminal resistance value becomes smaller in accordance with increase of the value of the code signal.

Japanese Unexamined Patent Application Publication No. 2008-182516 discloses a device which transmits and receives data through a transmission path. In this device, impedance of a transmitting device side is adjusted using a gate capacitance.

SUMMARY

The present inventors have found a problem described as follows. As shown in FIG. 9, in some of the four control signal lines NDRV[0] to [3], the signal state changes from "0" to "1" or from "1" to "0" as the value of the code signal is increased. Here, the number of the code signals whose state changes from "0" to "1" or from "1" to "0" when a code increases or decreases by one, is called "a hamming distance". For example, when the summation of the gate widths W of the terminal resistance elements 85N, which are connected to the transmission path 80, changes from "3" to "4", the control signals NDRV[0] and [1] change from "0" to "1" and the control signals NDRV[2] changes from "1" to "0". Therefore, when the summation of the gate widths W is "4", the hamming distance is "3". And the number of the code signal lines is "4", and the hamming distance is in a range from "0" to "4". When the hamming distance takes a maximum value, voltage levels of all code signals are changed.

In the device configuration disclosed in Japanese Unexamined Patent Application Publication No. 2006-66833, a ratio of gate widths W of the terminal resistance elements 85N and 85P is 1:2:4:8. The gate widths of the terminal resistance elements 85N and 85P have different values of multiples of $2^n$. The control signals NDRV and PDRV are binary codes representing a value using a binary number. Therefore, when the code is sequentially changed, there may be the case that the number of code lines, in which the voltage level changes from "0" to "1" or from "1" to "0", is large. That is, there may be the case that the hamming distance becomes large as the code is increased in order.

The hamming distance is "1", and the terminal distance changes once. However, when the hamming distance becomes larger, the number of times of changes in the terminal resistance increases. As a result, until the signal states of all code signals change, a state of a terminal resistance value is unsteady. When the hamming distance is large, the terminal resistance of the variable terminal resistance unit temporarily changes. Therefore, an electromotive force occurs in a terminal voltage in accordance with a change of current. This electromotive force causes noise in the terminal voltage. The noise occurring in the terminal voltage makes the quality of a waveform worse and causes operation errors in the semiconductor devices.

A first exemplary aspect of the present invention is a terminal resistance device including a variable terminal resistance unit including a plurality of first terminal resistance elements connectable to a transmission path and a terminal resistance control unit that transmits a first control signal of a thermometer code to the variable terminal resistance unit. The first terminal resistance elements have the same resistance value and the first control signal is a signal for selecting the first terminal resistance elements to be connected to the transmission path.

A second exemplary aspect of the present invention is a control method for a terminal resistance including transmitting a first control signal of a thermometer code to a plurality of first terminal resistance elements connectable to a transmission path and having the same resistance value to select the first terminal resistance elements to be connected to the transmission path.

The present invention seeks to solve one or more of the above problems. Specifically, in the first exemplary aspect of the present invention, the plurality of the first terminal resistance elements which have the same resistance values are selected according to the thermometer code and connected to the transmission path. Therefore, the number of the code signal lines, in which the signal state changes, can be reduced as the terminal resistance is changed. That is, the hamming distance can be reduced as the terminal resistance. Therefore, the noise occurring in the transmission path each time the code changes at a terminal resistance setting can be reduced.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

[First Exemplary Embodiment]

Figure 1:
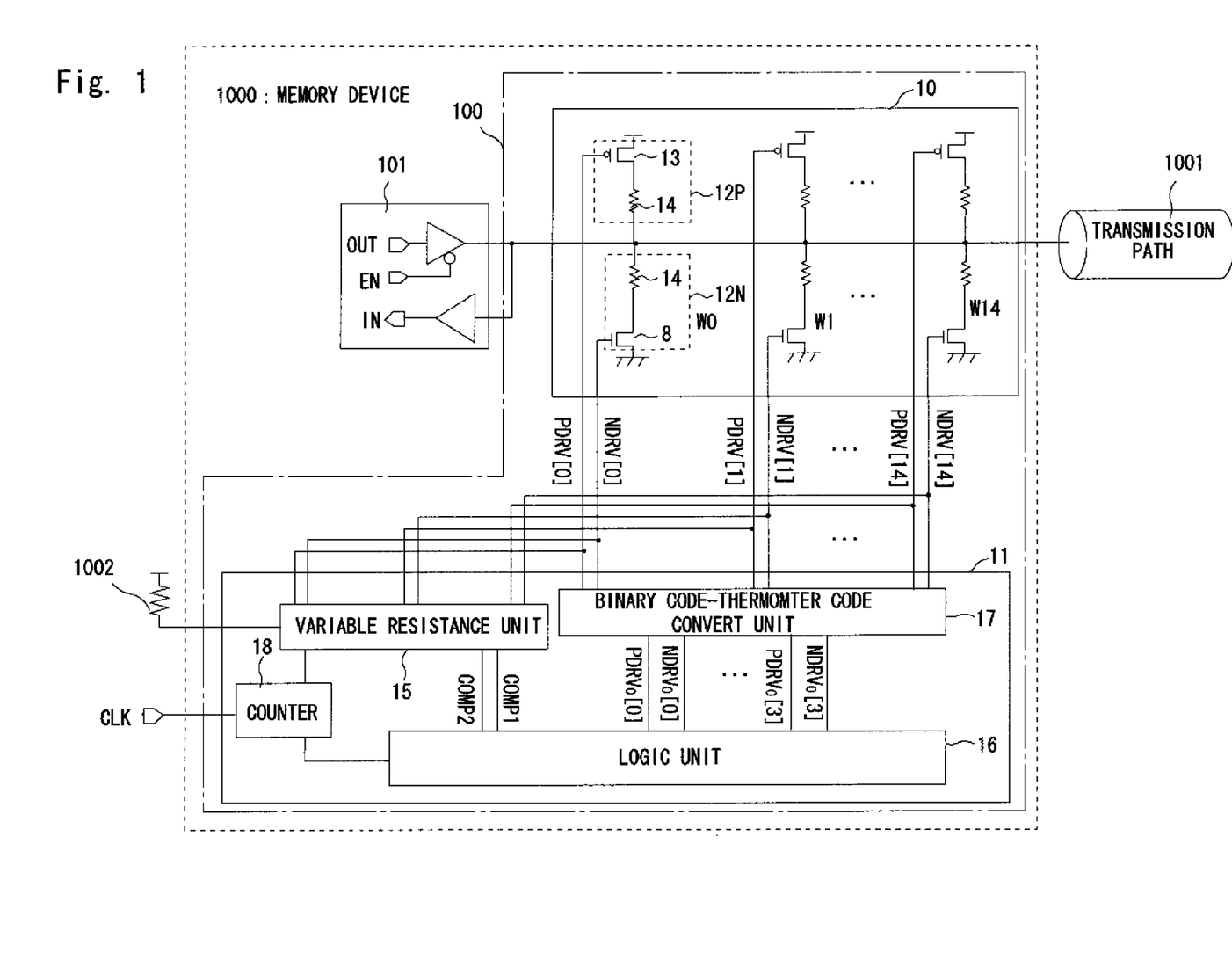
FIG. 1 is a diagram showing an exemplary overall configuration of a terminal resistance device 100 according to a first exemplary embodiment of the present invention.

FIG. 1 shows an exemplary overall configuration of a terminal resistance device 100 according to a first exemplary embodiment of the invention. In the terminal resistance device 100, a terminal resistance of a transmission path 1001 through which data is transmitted and received is adjusted at receiving side. Hereinafter, this explanation assumes that the terminal resistance device 100 is provided in a memory device 1000. However, the invention is not limited to the device in which the terminal resistance is adjusted at receiving side as described in this explanation. That is, the terminal resistance device 100 may be configured to adjust the terminal resistance at transmitting side. The terminal resistance device 100 is also not limited to a device included in the memory device 1000, and can be provided in a Large Scale Integration Circuit (LSI), for example.

The terminal resistance device 100 is provided between an input/output buffer 101 and the transmission path 1001. This explanation assumes that the terminal resistance device 100 is configured to adjust a variable terminal resistance in 16 levels. However, the invention is not limited to the above configuration, and may be configured to adjust the variable terminal resistance in any levels. The terminal resistance device 100 includes a variable terminal resistance unit 10 and a terminal resistance control unit 11. The variable terminal resistance unit 10 includes a plurality of first terminal resistance elements 12N and 12P having the same resistance value and connectable to the transmission path 1001. The terminal resistance control unit 11 selects the first terminal resistance elements 12N and 12P, which is connected to the transmission path 1001, by transmitting a first control signal (PDRV, NDRV) of a thermometer code to the variable terminal resistance unit 10.

In the variable terminal resistance unit 10, 15 first terminal resistance elements 12N having the same resistance value are provided between the transmission path 1001 and a ground line. Each of the first terminal resistance elements 12N includes a switching element 8 of N-type transistor and a first resistance element 14. In the same way, 15 first terminal resistance elements 12P having the same resistance value are provided between the transmission path 1001 and a source voltage line. Each of the first terminal resistance elements 12P includes a switching element 13 of P-type transistor and a first resistance element 14. In FIG. 1, some terminal resistance elements 12P and 12N are not illustrated for abbreviation.

Each of the first terminal resistance elements 12N and 12P is configured with the resistance element and the switching element as described above, and may be configured with one N-type or P-type MOS transistor. Further, each of the first terminal resistance elements 12N and 12P may be configured with a metal line (a liner resistance) and a MOS transistor for switching.

In the first terminal resistance element 12N, one terminal of the first resistance element 14 is connected to the transmission path 1001 and another terminal thereof is connected to the switching element 8. The switching element 8 has one terminal 8 connected to the first resistance element 14, another terminal connected to the ground voltage line, and a gate receiving the control signal NDRV. When the N-type transistors (the switching transistors 8) are activated by the control signal NDRV, the plurality of the first terminal resistance elements 12N are connected in parallel between the ground voltage line and the transmission path 1001.

Similarly, in the first terminal resistance element 12P, one terminal of the first resistance element 14 is connected to the transmission path 1001 and another terminal thereof is connected to the p-type switching element 13. The switching element 13 has one terminal 8 connected to the first resistance element 14, another terminal connected to the source voltage line, and a gate receiving the control signal PDRV. When the P-type transistors (the switching transistors 13) are activated by the control signal PDRV, the plurality of the first terminal resistance elements 12P are connected in parallel between the source voltage line and the transmission path 1001.

In the first exemplary embodiment, each of the first terminal resistance elements 12N and 12P is configured to have the same resistance value. That is, a combined resistance of the switching element 8 and the first terminal element 14 is set to the same value among all the first terminal resistance elements 12N. A combined resistance of the switching element 13 and the first terminal element 14 is set to the same value among all the first terminal resistance elements 12P.

Here, the resistance value can be adjusted by changing a gate width of the transistor. When each one of the first terminal resistance elements 12N is assumed to be configured with only one transistor, a gate width of one transistor is called the gate width W. Hereinafter, the resistance value of the first terminal resistance elements 12N will be explained using the gate widths W. When each of the first terminal resistance elements 12N is assumed to be configured with one transistor, the gate widths W of the transistors are represented by W0, W1, W2 . . . , W13 and W14 in the order from the left side in FIG. 1. In the first exemplary embodiment, all the first terminal resistance elements 12N have the same resistance value. Therefore, the resistance ratio of W0:W1:W2 . . . W13:W14 is 1:1:1 . . . 1:1. In the same way, when each one of the first terminal resistance elements 12P is assumed to be configured with one transistor having the gate width W, the first terminal resistance elements 12P are configured to have the same gate width W.

The terminal resistance control unit 11 includes a logic unit 16, a variable resistance unit 15, a counter 18, and a binary code-thermometer code convert unit 17.

The variable resistance unit 15 includes compare resistance elements as described later. The compare resistance elements correspond to the first terminal resistance elements 12N and 12P included in the variable terminal resistance unit 10. The compare resistance elements receive the control signals NDRV and PDRV which are transmitted to the first terminal resistance elements 12N and 12P, respectively. The compare resistances are connected to a detect point in accordance with the control signals NDRV and PDRV. The logic unit 16 compares a voltage of the detect point and a reference voltage of a resistance 1002 and sets signal states of the control signals NDRV and PDRV. Detailed explanation is described later.

The logic circuit 16 generates code signals $NDRV_0$ and $PDRV_0$ according to an output of the counter 18 which operates based on a clock CLK. The code signals $NDRV_0$ and $PDRV_0$ generated in the logic unit 16 are a binary code representing a value as a binary number using "0" and "1". The code signals $NDRV_0$ and $PDRV_0$ representing a binary code are output to the binary code-thermometer code convert unit 17.

The binary code-thermometer code convert unit 17 receives the code signals $NDRV_0$ and $PDRV_0$ generated in the logic circuit 16, converts the code signals $NDRV_0$ and $PDRV_0$ to the control signals NDRV and PDRV, and outputs the control signals NDRV and PDRV to the variable terminal resistance unit 10. Here, the thermometer code is a code representing a value as the number of values of "0" or "1". For example, when the value "5" is represented using the number of values of "1", five code signals are set to "1", and other signals are set to "0". The control signals NDRV and PDRV which are the thermometer codes generated in the binary code-thermometer code convert unit 17 are transmitted to the variable terminal resistance unit 10 as well as the variable resistance unit 15.

Figure 2:
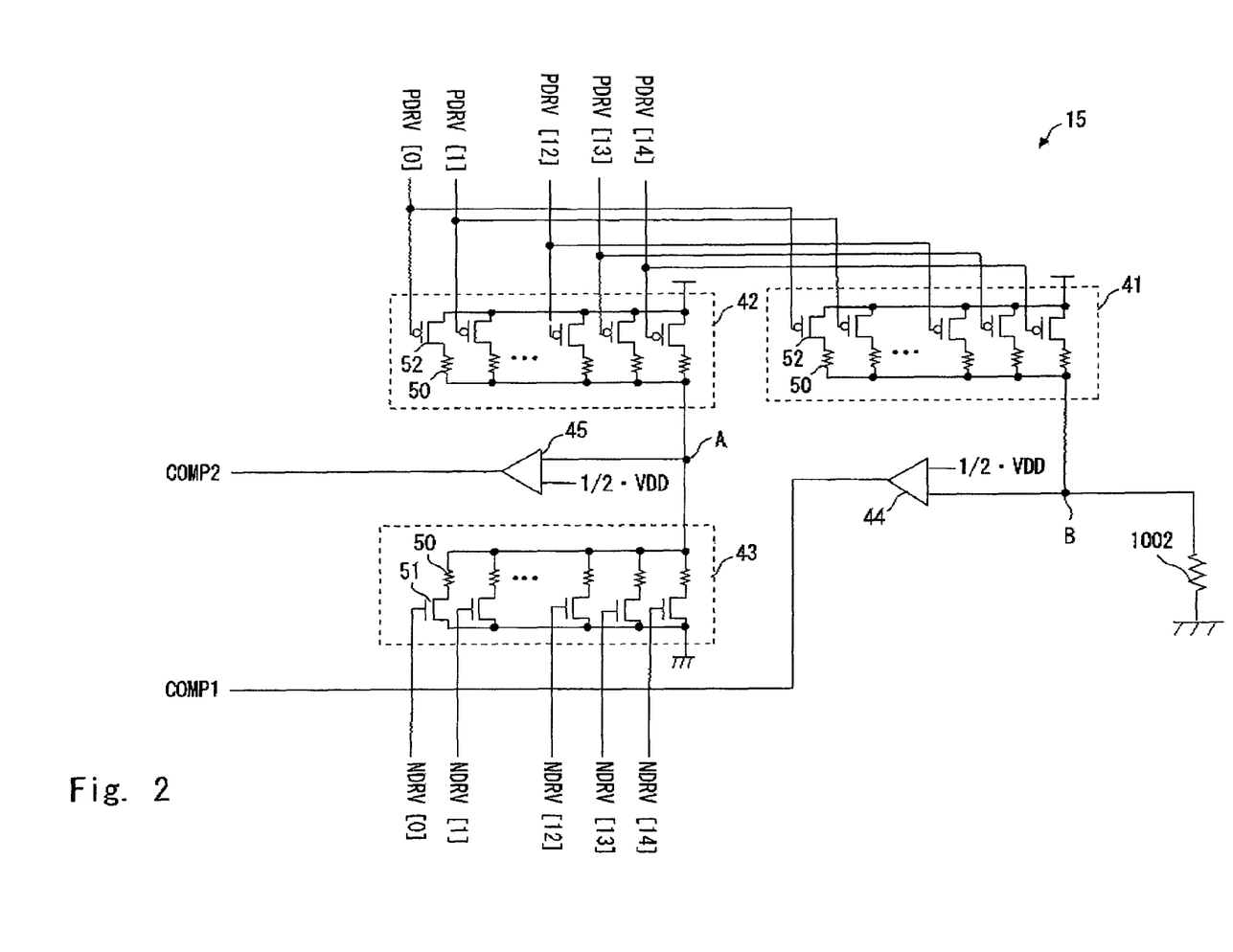
FIG. 2 is a diagram showing a variable resistance unit 15 in the terminal resistance device 100 according to the first exemplary embodiment of the present invention.

In reference to FIG. 2, a detailed configuration of the variable resistance unit 15 will be described. The variable resistance unit 15 includes a unit of compare resistance element group 43 having the compare resistance elements respectively corresponding to the terminal resistance elements 12N, and two units of compare resistance element groups 41 and 42 having the compare resistance elements respectively corresponding to the terminal resistance elements 12P. The compare resistor element group 43 is provided between a detect point A and the ground voltage line and the compare resistor element group 42 is provided between the detect point A and the source voltage line. The compare resistance element group 41 is provided between the source voltage line and a detect point B.

The compare resistance element group 43 includes a resistance element 50 and a switching element 51 of N-type transistor which switches a connection between the resistance element 50 and the detection point A. The resistance element 50 and the switching element 51 are connected in series. Fifteen pairs of the resistance 50 and the switching element 51 respectively correspond to 15 pairs of the switching element 8 and the first resistance element 14 included in the first terminal resistance element 12N. A gate of the switching element 51 receives the same control signal NDRV which is received to the corresponding switching element 8. The 15 pairs of the resistance element 50 and the switching element 51 are connected in parallel between the detect point A and the ground voltage line. Combined resistances of the resistance element 50 and the switching element 51 are configured to be the same value among the fifteen pairs as the first terminal resistance element 12N. To put it another way with using the gate width W, when the resistance element 50 and the switching element 51 are assumed to be configured with only one transistor, the gate width W of each transistor is set to the same value among the 15 pairs.

In the same way, the compare resistance element group 42 connected between the source voltage and the detect point A includes 15 pairs of the resistance element 50 and a switching element 52 of P-type transistor. The resistance elements 50 and the switching elements 52 respectively correspond to the first resistance element 14 and the switching element 13 included in the first terminal resistance element 12P. A gate of the switching element 52 receives the same control signal PDRV which is received to the switching element 13 of the corresponding first terminal resistance element 12P.

A voltage level of the detect point A is determined by resistance values of the compare resistance element groups 42 and 43 which are connected to the detect point A. The voltage level of the detect point A is transmitted to one terminal of a compare circuit 45. The compare circuit 45 compares the voltage level of the detect point A received to the one terminal and ½ VDD received to another terminal and outputs a comparative result COMP2 to the logic unit 16.

The compare resistance element group 41 connected between the source voltage line and the detect point B has almost the same configuration as the compare resistance element group 42. Detailed explanation of the compare resistance element group 41 is omitted because it has substantially the same configuration as the compare resistance element group 42. A reference resistance 1002 is connected between the detect point B and the ground. A voltage level of the detect point B is determined by resistance values of the reference resistance 1002 and the compare resistance element group 41. A compare circuit 44 receives the voltage level of the detect point B at one terminal and ½ VDD at another terminal, and outputs a comparative result COMP1 to the logic unit 16.

In reference to FIG. 2, a method for setting the terminal resistance in the terminal resistance device 100 configured as described above will be explained. The logic unit 16 sets a value of the terminal resistance in accordance with the comparative results COMP1 and COMP2 transmitted from the compare circuits 44 and 45. Hereinafter, each step is specifically described. The logic circuit 16 sets the compare resistance element group 41 at a first step and sets the compare resistance element group 43 as a second step. Firstly, in the first step, the logic unit 16 changes the control signals PDRV[0] to [14] by incrementing the code signals until a signal state of the comparative result COMP1 transmitted from the compare circuit 44 changes. The compare resistance element 41 changes a connection to the detect point B every time the control signals PDRV are changed and the voltage level of the detect point B changes.

The logic unit 16 monitors the comparative result COMP1. The logic unit 16 stores the states of the control signals PDRV[0] to [14] when the state of the comparative result COMP1 changes or immediately before the state of the comparative result COMP1 changes. The change of the output of the comparative result COMP1 represents that the voltage level of the detect point B which is determined by the reference resistance 1002 and the compare resistance element group 41 becomes ½ VDD around the previous adjacent changing of the control signals PDRV. In other words, when the signal state of the comparative result COMP1 changes, a resistance value of the compare resistance element group 41 and a resistance value of the reference resistance 1002 are almost the same. Therefore, the logic unit 16 memories the signal states of the control signals PDRV[0] to [14] at this time or the signal states of the control signals PDRV[0] to [14] just before the time, and ends the first step of setting the control signals PDRV[0] to [14].

Next, in the second step, a resistance value of the compare resistance element group 43 is determined. The compare resistance element group 42 which receives the same control signals PDRV[0] to [14] as the compare resistance element group 41 indicates a certain resistance value because the setting of the control signals PDRV[0] to [14] is finished in the first step. When the above state is maintained, the code signals are incremented in order to change the control signals NDRV. Therefore, the voltage of the detect point A changes depending on the number of the compare resistance elements, which is connected to the detect point A.

The logic unit 16 monitors the comparative result COMP2 of the compare circuit 45 and changes the control signals NDRV until a state of the comparative result COMP2 changes. The logic unit 16 stores the signal states of the control signals NDRV when the state of the comparative result COMP2 changes or immediately before the state of the comparative result COMP2 changes and completes the setting of the control signals NDRV. The change of the output of the comparative result COMP2 represents that the voltage level of the detect point A which is determined by the compare resistance element groups 42 and 43 becomes around ½ VDD. As described above, the control signals PDRV[0] to [14] and NDRV[0] to [14] by the method of setting the control signals in the first step and the second step.

When the logic circuit 16 is setting the control signals PDRV[0] to [14] and NDRV[0] to [14], the variable terminal resistance unit 10 receives the control signals PDRV[0] to [14] and NDRV[0] to [14]. The variable terminal resistance unit 10 receives the control signals PDRV[0] to [14] and NDRV[0] to [14] determined by the logic unit 16 also after the end of setting. In this way, the terminal resistance which is configured with the variable resistance unit 10 is determined.

Figure 3:
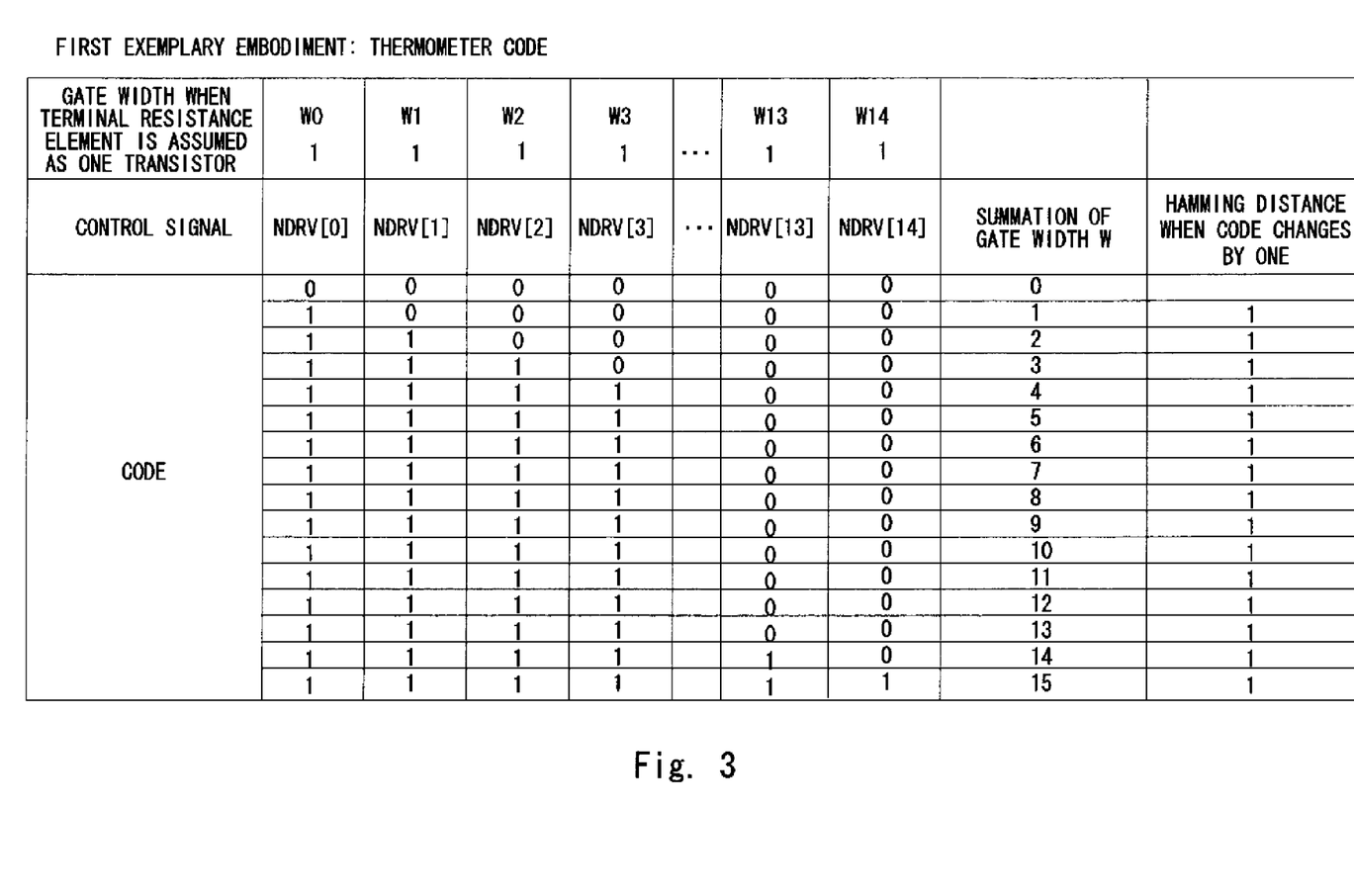
FIG. 3 is a table showing changing states of code signals in the terminal resistance device 100 according to the first exemplary embodiment.

Next, advantageous effects of the terminal resistance device 100 according to the first exemplary embodiment of the invention will be described. FIG. 3 shows changing states of the code signals in the terminal resistance device 100 according to the first exemplary embodiment of the invention. As described above, the control signals NDRV and PDRV are individually set so that the first terminal resistance elements 12N and 12P to be connected to the transmission path 1001 are selected. However, for the sake of shorthand, a change of the code signals at the time of setting for connection of the first terminal resistance elements 12N will be explained as an example.

In the first exemplary embodiment, the gate widths W of all the first terminal resistance elements 12N are set to the same value. Therefore, when the code signal are incremented at the time of setting the resistance value of the first terminal resistance elements 12N, the first terminal resistance elements 12N are connected to the transmission path 1001 one by one. Specifically, when the summation of the gate widths W of the first terminal resistance elements 12N, which are connected to the transmission path 1001, is set to "0", all the control signals NDRV[0] to [14] are set to "0" and all first terminal resistance elements 12N are disconnected from the transmission path 1001.

When the summation of the gate widths W of the first terminal resistance elements 12N, which are connected to the transmission path 1001, is set to "1", only the control signal NDRV[0] is set to "1" and the other control signals NDRV[1] to [14] are set to "0". As a result, the control signal NDRV[0] changes from "0" to "1" and the first terminal resistance element 12N, which receives the control signal NDRV[0], is connected to the transmission path 1001.

When the code increases, any of the 15 control signals NDRV changes from "0" to "1" one by one. Here, the number of the code signals whose signal state changes from "0" to "1" or from "1" to "0" when a code increases or decrease by one, is called "a hamming distance". For example, when the summation of the gate widths W of activated transistors changes from "2" to "3", the control signal NDRV[2] changes from "0" to "1". Accordingly, when the summation of the gate widths W is "3", the hamming distance is "1". In the first exemplary embodiment, all the first terminal resistance transistors 12N are configured to have the same gate width W. Therefore, the hamming distance is "1" in every changing operation at the time of varying the summation of the gate widths W of the activated transistors in 16 levels.

Figure 4:
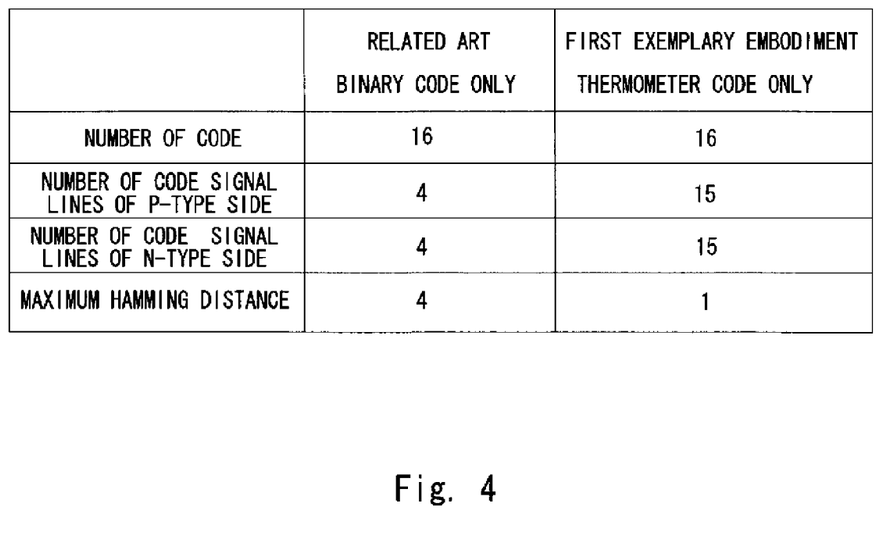
FIG. 4 is a table showing the number of the code signals, the number of code signal lines, and a hamming distance in a related art shown in FIG. 8 and the terminal resistance device 100 according to the first exemplary embodiment.

FIG. 4 shows a value of the code signal, the number of code signal lines, and the hamming distance in the related art shown in FIG. 8 and the terminal resistance device 100 according to the first exemplary embodiment of the invention. In the related art and the first exemplary embodiment, the resistance value can be adjusted in 16 levels by using the terminal resistance elements on the N-type side and P-type side. That is, in the related art and the first exemplary embodiment, the value of the code signal is 16. In the related art, four signal code lines are provided for each of the N-type side and P-type side. On the other hand, in the first exemplary embodiment, fifteen code signal lines are provided for each N-type side and P-type side. In the related art, a maximum value of the hamming distance is four, and it is one in the first exemplary embodiment.

In a method as disclosed in the related art where the terminal resistance elements are switched between connection and disconnection to and from the transmission path by the binary code, the maximum value of the hamming distance is equal to the number of the code signal lines. On the other hand, in the first exemplary embodiment where the terminal resistance elements are switched between connection and disconnection to and from the transmission path by the thermometer code, the maximum value of the hamming distance is one. When the hamming distance is one, the number of times of changes in the terminal resistance is one. The smaller the hamming distance is, the smaller the number of times of changes in the terminal resistance becomes and the steadier terminal resistance is while all the code signals change. In the first exemplary embodiment, the gate width W is set to the same value among the first terminal resistance elements, and the connection of the terminal resistance elements to the transmission path is changed by using the thermometer code. Therefore, because an influence caused by a change of current upon electromotive force of the terminal resistance can be reduced and a source of noise occurrence in the terminal resistance can be reduced.

[Second Exemplary Embodiment]

Figure 5:
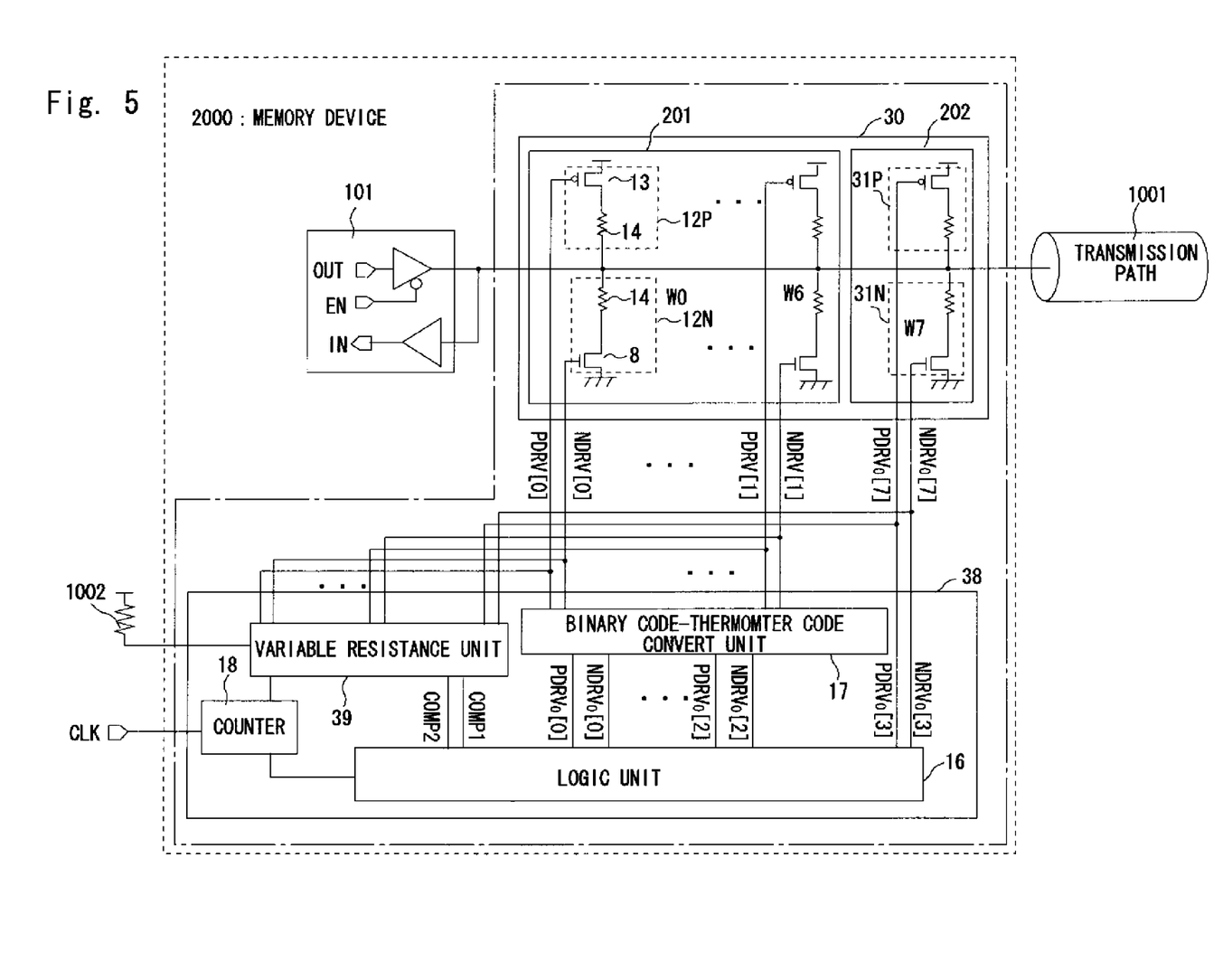
FIG. 5 is a diagram showing an exemplary overall configuration of a terminal resistance device 30 according to a second exemplary embodiment of the present invention.

A second exemplary embodiment of the invention will be explained. FIG. 5 shows an exemplary configuration of the terminal resistance device according to the second exemplary embodiment of the invention. One aspect of the second exemplary embodiment is that the binary code-thermometer code convert unit 17 converts a part of the code signals of the binary code generated in the logic unit 16 and transmits a converted code to a variable terminal resistance unit 30. And the rest of the code signals of the binary code is not converted and transmitted to the variable terminal resistance unit 30. The variable terminal resistance unit 30 includes a first terminal resistance unit 201 having the first resistance elements 12N and 12P which have the same resistance value, and a second terminal resistance unit 202 having second terminal resistance elements 31N and 31P which have different resistance values from each other. The second resistance elements 31N and 31P are configured to have a resistance value which is $2^n$ times the first resistance value of the first terminal resistance elements 12N and 12P. "n" represents a positive or negative integer. In the second exemplary embodiment, one code signal is configured as the binary code.

In the case in which the terminal resistance is configured to cover a range of a reference resistance as in the first exemplary embodiment, that is, the terminal resistance is configured to adjust a resistance value in 16 levels, the variable terminal resistance unit 30 requires eight terminal resistance elements 12N and 31N which have a resistance ratio of 1:1:1:1:1:1:1:2, and the eight code signal lines which control the connection of the eight terminal resistance elements 12N and 31N to the transmission path 1001. When the resistance ratio of the terminal resistance elements 12N and 31N is represented using the gate widths W and the gate widths W are represented by W0, W1, W2, . . . , and W7 in the order from the left side in FIG. 5, the gate width ratio W0:W1:W2 . . . :W7 is 2:2:2:2:2:2:2:1. The second terminal resistance elements 31P and 31N are different from the first terminal resistance elements 12N and 12P only in the resistance value, and have the same connection relation as the first terminal elements 12N and 12P. Therefore, an explanation of the second terminal resistance elements is omitted.

The control signals PDRV[0] to [7] and NDRV[0] to [7] of the thermometer code which is converted from the binary code by the binary code-thermometer code converter 17 control a connection of the first terminal resistance elements 12N and 12P to the transmission path 1001 as in the first exemplary embodiment. On the other hand, the control signals $NDRV_0$ and $PDRV_0$ of the binary code generated in the logic unit 16 control a connection of the second terminal resistance elements 31N and 31P to the transmission path 1001. That is, the second terminal resistance elements 31N and 31P receive the control signals $NDRV_0$ and $PDRV_0$ without passing through the binary code-thermometer code converter 17. The terminal resistance configured with the variable terminal resistance unit 30 is determined by the first terminal resistance elements 12N and 12P and the second terminal resistance elements 31N and 31P, which are connected to the transmission path 1001.

As the first exemplary embodiment, a variable resistance 39 included in a terminal resistance control unit 38 provides a compare resistance group having compare resistance elements corresponding to the first terminal resistance elements 12N and 12P and the second terminal resistance elements 31N and 31P in the variable terminal resistance unit 30. The control signals NDRV and PDRV of the thermometer code generated by the binary code-thermometer code convert unit 17 changes the connection of the compare resistance elements corresponding to the first terminal resistance elements 12N and 12P to a detect point. On the other hand, the control signals $NDRV_0$ and $PDRV_0$ of the binary code generated by the logic unit 16 changes the connection of the compare resistance elements corresponding to the second terminal resistance elements 31N and 31P to a detect point. The detailed configuration is almost the same as the first exemplary embodiment and the explanation thereof is omitted.

An operation of a terminal resistance device 30 according to the second exemplary embodiment configured as described above will be explained. The terminal resistance control unit 38 operates the counter 18 based on the clock CLK to generate the code signal of the binary code in the logic unit 16. The binary code-thermometer code convert unit 17 converts a part of the code signals of the binary code to the thermometer code and transmits the thermometer code to the first variable terminal resistance unit 201. The rest of the code signal of the binary code generated in the logic unit 16 is not converted to the thermometer code and is transmitted to the second variable terminal resistance unit 202 directly.

As the first exemplary embodiment, the variable resistance unit 39 receives the thermometer codes NDRV and PDRV generated in the binary code-thermometer code convert unit 17 and the code signals $NDRV_0$ and $PDRV_0$ of the binary code generated in the logic unit 16. The logic unit 16 monitors the comparative result representing a result of comparing between a voltage of the detect point and a reference voltage in the variable terminal resistance unit 30. The logic unit 16 sets the terminal resistance value realized by the variable terminal resistance unit 30 using the control signals NDRV, PDRV, $NDRV_0$, and $PDRV_0$, which are obtained at the time when the voltage of the detect point and the reference voltage are substantially equal.

Figure 6:
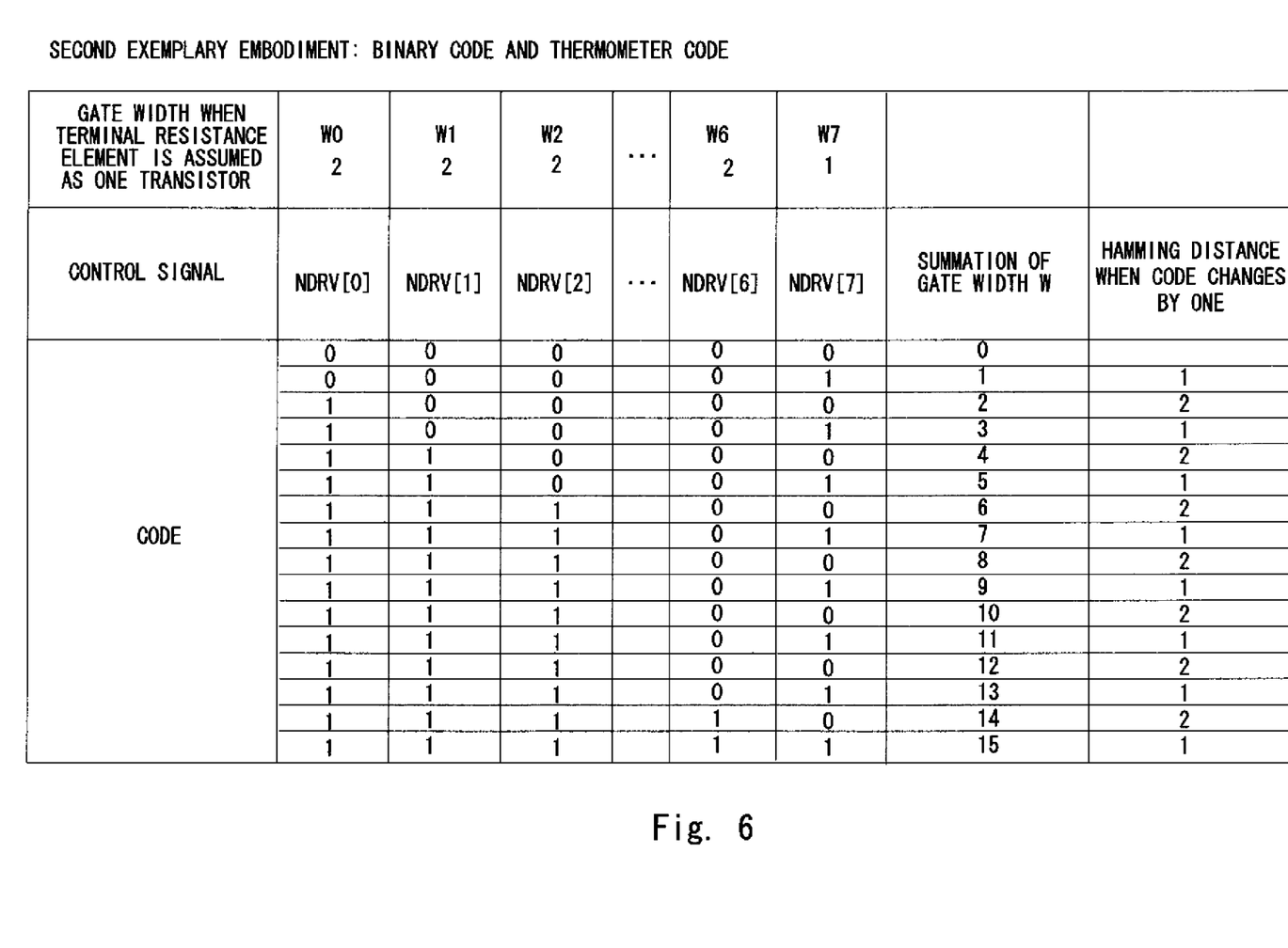
FIG. 6 is a table showing changing states of code signals in the terminal resistance device 30 according to the second exemplary embodiment.

FIG. 6 shows changing states of the code signals in the terminal resistance device 30 according to the second exemplary embodiment. In the second exemplary embodiment, the number of signals of the control signals NDRV and PDRV which are thermometer codes decreases to seven and the maximum value of the hamming distance is two. In the terminal resistance device 30 according to the second exemplary embodiment, the maximum hamming distance increases compared to the first exemplary embodiment. However, in the second exemplary embodiment, the maximum hamming distance can be reduced compared to the related art in which all control signals are configured with the binary code, and noise occurring when the code is changed at changing of code can be reduced compared to the related art.

In the first exemplary embodiment, because all code signals are configured with thermometer code to decrease the hamming distance, the number of the code signal lines increases to 30 (15 lines on P-type side and 5 lines on N-type side) than the related art of eight lines (four lines on P-type side and four lines on N-type side). That is, in the first exemplary embodiment, a large wire region for the code signal lines is required. On the other hand, in the second exemplary embodiment, because both the binary code and the thermometer code are used for the control signals, the wire region can be reduced than that in the first exemplary embodiment.

[Third Exemplary Embodiment]

Next, an exemplary configuration of a terminal resistance device according to the third exemplary embodiment of the invention will be explained. In the third exemplary embodiment, two binary code signals are provided for each of the N-type side and P-type side in order to reduce the number of code signal lines compared to the second exemplary embodiment. In this configuration, the number of the signal lines of a thermometer code unit is three, and a total number of the signal lines is five. The overall configuration of the third exemplary embodiment is almost same as the second exemplary embodiment and an explanation thereof is omitted.

Figure 7:
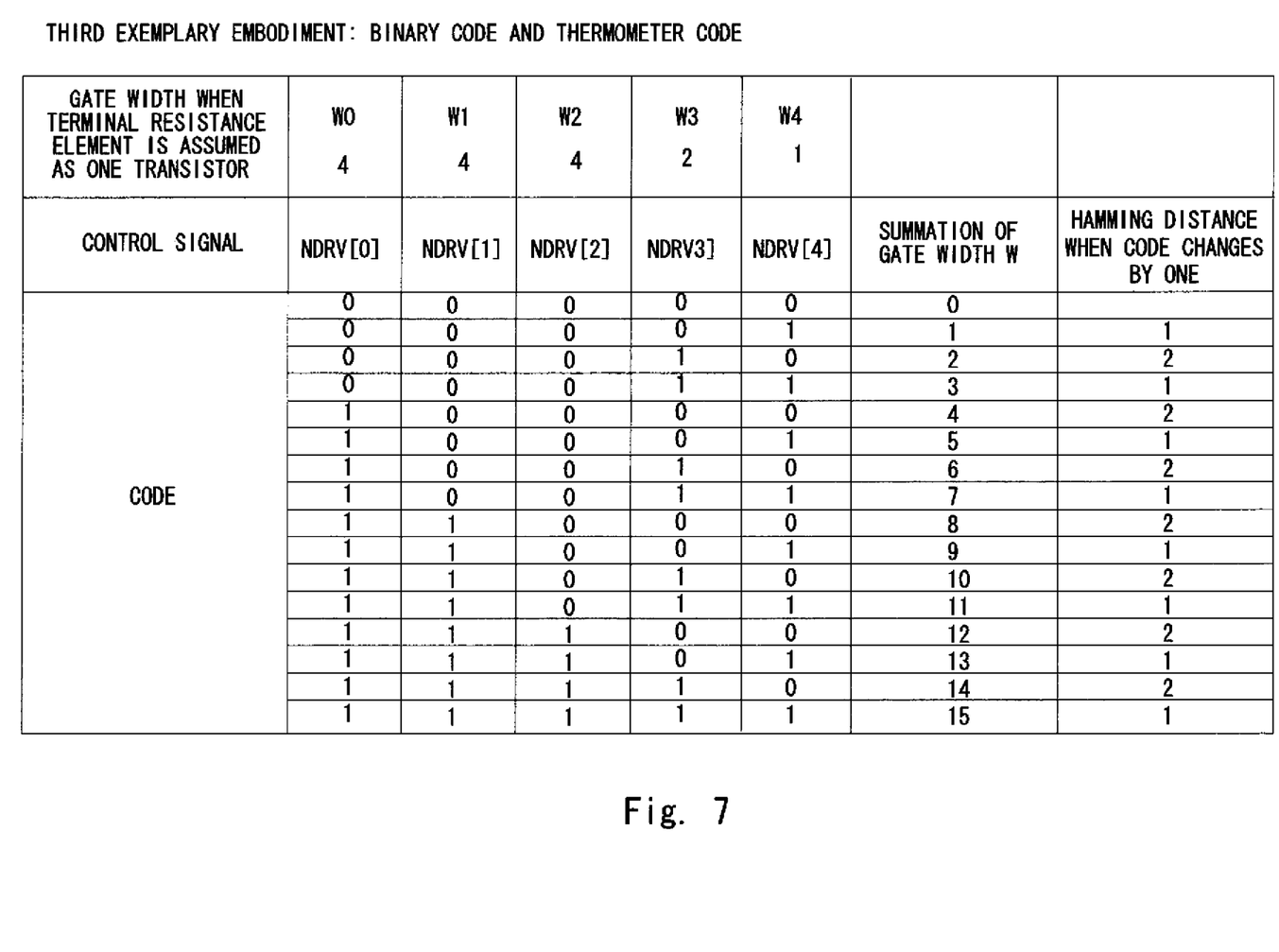
FIG. 7 is a table showing changing states of code signals in a terminal resistance device 300 according to a third exemplary embodiment of the present invention.

FIG. 7 shows changing states of the code signals in the terminal resistance device according to the third exemplary embodiment of the invention. In this way, because the number of the binary code signals is two, the hamming distance can be reduced compared to the related art. That is, because a part of the code signals is configured with the thermometer code, noise generated in a terminal voltage can be reduced. Further, the number of the code signals can be further reduced than in the second exemplary embodiment.

As described above, according to exemplary embodiments of the invention, when the terminal resistance device is configured to adjust the terminal resistance value in $2^K$ levels, the number of code signal lines, which are configured with the thermometer code, is set to be equal to or more than K−2. Therefore, the hamming distance can be reduced compared to the related art in which all control signals are configured with the binary code.

The first to third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A terminal resistance device comprising:
    a variable terminal resistance unit including a plurality of first terminal resistance elements connectable to a transmission path, and at least one second terminal resistance element connectable to the transmission path; and
    a terminal resistance control unit that transmits a first control signal of a thermometer code to the variable terminal resistance unit and a second control signal of a binary code to the variable terminal resistance unit, the first control signal being for selecting the first terminal resistance elements to be connected to the transmission path, the second control signal being for selecting the at least one second terminal resistance element to be connected to the transmission path,
    wherein the first terminal resistance elements have the same resistance value,
    wherein the at least one second terminal resistance element has a resistance value which is $2^n$ times a resistance value of each of the first terminal resistance elements so as to define a series of terminal resistance values having respectively resistance values R and $R*2^n$ (R represents the resistance value of the plural first terminal resistance elements having the same resistance value, n represents a positive or negative integer, and $R*2^n$ represents the resistance value of the second terminal resistance element), and
    wherein the terminal resistance control unit comprises a binary code-thermometer code convert unit which converts a received binary code to the thermometer code.

2. The terminal resistance device according to claim 1, wherein the terminal resistance control unit comprises:
    a variable resistance unit which includes a plurality of compare resistance elements connectable to a detect point and respectively corresponding to the first terminal resistance elements, and a compare circuit that compares a voltage of the detect point and a reference voltage; and
    a logic unit that selects the first terminal resistance elements to be connected to the transmission path based on a comparison result of the compare circuit,
    wherein the compare resistance elements are switched to be connected to the detect point based on the first control signal which is transmitted to the corresponding first terminal resistance elements.

3. The terminal resistance device according to claim 1, wherein each of the first terminal resistance elements has a resistance element having a resistance value set by adjusting a gate width and a switching element which switches a connection between the first terminal resistance element and the transmission path based on the first control signal.

4. The terminal resistance device according to claim 3, wherein the switching element is configured with a metal-oxide semiconductor field-effect transistor.

5. The terminal resistance device according to claim 1, wherein the first terminal resistance elements are configured with transistors.

6. A semiconductor device comprising a terminal resistance device according to claim 1.

7. The semiconductor device according to claim 6 being a semiconductor memory.

8. A control method for a terminal resistance comprising:
transmitting a first control signal of a thermometer code to a variable terminal resistance unit including a plurality of first terminal resistance elements connectable to a transmission path and at least one second terminal resistance element connectable to the transmission path, the first control signal being for selecting the first terminal resistance elements to be connected to the transmission path, wherein the terminal resistance control unit has been derived from a binary code-thermometer code convert unit which converts a received binary code to the thermometer code; and
transmitting a second control signal of a binary code to variable terminal resistance unit, the second control signal being for selecting the at least one second terminal resistance element to be connected to the transmission path,
wherein the first terminal resistance elements have the same resistance value, and
wherein the at least one second terminal resistance element has a resistance value which is $2^n$ times a resistance value of each of the first terminal resistance elements so as to define a series of terminal resistance elements having respectively resistance values R and $R*2^n$ (R represents the resistance value of the plural first terminal resistance elements having the same resistance value, n represents a positive or negative integer, and $R*2^n$ represents the resistance value of the second terminal resistance element).

9. The terminal resistance device according to claim 1, wherein,
the variable terminal resistance unit includes plural second terminal resistance elements connectable to the transmission path, the second terminal resistance elements each have a resistance value which is $2^n$ times a resistance value of each of the first terminal resistance elements so as to define a series of resistance elements having respectively resistance values R, R, and $R*2^n$ (R represents the resistance value of the plural first terminal resistance elements having the same resistance value, n represents a positive or negative integer, and $R*2^n$ represents the resistance value of the second terminal resistance element), the terminal resistance control unit transmits the second control signal of a binary code to the variable terminal resistance unit,
the second control signal is for selecting the at least one second terminal resistance element to be connected to the transmission path, and
each of i) the terminal resistance elements controlled by the binary code and ii) the terminal resistance elements controlled by the thermometer code connected to the transmission path.

10. A terminal resistance device, comprising:
a variable terminal resistance unit including
i) a first terminal resistance unit having a plurality of first terminal resistance elements connectable to a transmission path, each of the first terminal resistance elements having the same resistance value, and
ii) a second terminal resistance unit having second terminal resistance elements connectable to a transmission path, the second resistance elements each having a resistance value which is $2^n$ times a resistance value of the first terminal resistance elements, so as to define a series of first and second terminal resistance elements having respectively resistance values R and $R*2^n$, where R is the resistance value of the plural first terminal resistance elements having the same resistance value, n is a non-zero integer, and $R*2^n$ represents the resistance value of the second terminal resistance element; and
a terminal resistance control unit that transmits i) a first control signal of a thermometer code to the first variable terminal resistance unit, the first control signal being for selecting the first terminal resistance elements of to be connected to the transmission path, and ii) further transmits a second control signal of a binary code to the variable terminal resistance unit, the second control signal for selecting the second terminal resistance elements to be connected to the transmission path,
a gate width of the first terminal resistance elements is different from a gate width of the second terminal resistance elements.

* * * * *